US00RE46238E

(19) United States
(12) Reissued Patent
Kang

(10) Patent Number: US RE46,238 E
(45) Date of Reissued Patent: Dec. 13, 2016

(54) SEMICONDUCTOR MEMORY DEVICE AND RELATED METHOD OF PROGRAMMING

(71) Applicant: SAMSUNG ELECTRONICS CO., LTD., Suwon-Si, Gyeonggi-Do (KR)

(72) Inventor: Sang Gu Kang, Suwon-Si (KR)

(73) Assignee: Samsung Electronics Co., Ltd., Suwon-si, Gyeonggi-do (KR)

(21) Appl. No.: 14/822,261

(22) Filed: Aug. 10, 2015

Related U.S. Patent Documents

Reissue of:

(64) Patent No.: 8,120,967
Issued: Feb. 21, 2012
Appl. No.: 12/730,525
Filed: Mar. 24, 2010

(30) Foreign Application Priority Data

Apr. 9, 2009 (KR) ..... 10-2009-0030877

(51) Int. Cl.
*G11C 16/06* (2006.01)
*G11C 11/56* (2006.01)
*G11C 16/34* (2006.01)

(52) U.S. Cl.
CPC ..... *G11C 11/5628* (2013.01); *G11C 16/3454* (2013.01); *G11C 2211/5621* (2013.01)

(58) Field of Classification Search
CPC ..... G11C 11/5628; G11C 16/3454; G11C 2211/5621
USPC ..... 365/185.22, 185.03, 185.17, 185.19
See application file for complete search history.

(56) References Cited

U.S. PATENT DOCUMENTS

| | | | | |
|---|---|---|---|---|
| 6,046,940 | A * | 4/2000 | Takeuchi et al. | 365/185.17 |
| 6,643,188 | B2 | 11/2003 | Tanaka et al. | |
| 7,046,568 | B2 | 5/2006 | Cernea | |
| 7,310,255 | B2 | 12/2007 | Chan | |
| 7,394,697 | B2 * | 7/2008 | Jyouno et al. | 365/185.19 |
| 7,561,474 | B2 | 7/2009 | Kim et al. | |
| 2006/0133138 | A1 | 6/2006 | Chen et al. | |
| 2008/0094912 | A1 | 4/2008 | Incarnati et al. | |
| 2011/0235420 | A1 * | 9/2011 | Sharon et al. | 365/185.17 |

FOREIGN PATENT DOCUMENTS

| | | |
|---|---|---|
| KR | 1020080089075 | 10/2008 |
| KR | 1020080089075 A | 10/2008 |

* cited by examiner

*Primary Examiner* — Ovidio Escalante
(74) *Attorney, Agent, or Firm* — Volentine & Whitt, PLLC

(57) ABSTRACT

A method of programming a nonvolatile memory device comprises applying a program voltage to a selected wordline to program selected memory cells, and performing a verify operation by applying a verify voltage to the selected wordline to determine the programming status of the selected memory cells. The verify operation applies the verify voltage to the selected wordline at least two different times to divide the selected memory cells into at least three regions corresponding to different threshold voltage ranges.

30 Claims, 10 Drawing Sheets

SEMICONDUCTOR MEMORY DEVICE AND RELATED METHOD OF PROGRAMMING

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims priority under 35 U.S.C. §119 to Korean Patent Application No. 10-2009-0030877 filed on Apr. 9, 2009, the disclosure of which is hereby incorporated by reference in its entirety.

BACKGROUND

Embodiments of the inventive concept relate generally to nonvolatile memory devices. More particularly, embodiments of the inventive concept relate to flash memory devices and related methods of programming.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power.

Examples of volatile memory devices include dynamic random access memory (DRAM), static random access memory (SRAM), and examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been an increase in the number of devices employing nonvolatile memory devices. As examples, nonvolatile memory devices are being used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

One way to increase the storage capacity of a nonvolatile memory device is by storing more than one bit of data in each memory cell. Nonvolatile memory devices storing more than one bit of data in each memory cell are called multi-level cell (MLC) devices because the memory cells store multiple levels of data, e.g., lower level bits, upper level bits, mid-level bits, and so on. A multi-level cell typically stores data by maintaining a threshold voltage within one of multiple threshold voltage distributions. For instance, in a two-bit MLC, four threshold voltage distributions may be used to store data "11", "10", "00", "01".

To reliably read an MLC device, the threshold voltage distributions in the MLCs must be separated enough so that they can be distinguished in a read operation. In other words, the MLCs must have a sufficient read margin to allow accurate data sensing. A common programming method for securing a sufficient read margin is incremental step pulse programming (ISPP). In ISPP, memory cells are programmed with multiple program loops each comprising a program step for applying a program pulse and a verify step for determining whether the memory cells have been adequately programmed. In each program loop, a successively larger program pulse is applied to the memory cells. The incremental difference between each successive pulse ($\Delta V$) is generally small to ensure a sufficient read margin. But unfortunately, using a small $\Delta V$ tends to increase the number of required pulses and the overall programming time, slowing the operation of MLC devices.

SUMMARY

Embodiments of the inventive concept provide program methods for reducing the program time.

According to one embodiment of the inventive concept, a method of programming a nonvolatile memory device comprises applying a program voltage to a selected wordline to program selected memory cells, and performing a verify operation by applying a verify voltage to the selected wordline to determine the programming status of the selected memory cells. In this embodiment, the verify operation applies the verify voltage to the selected wordline at least two different times to divide the selected memory cells into at least three regions corresponding to different threshold voltage ranges.

In certain embodiments, the verify voltage is applied to the selected wordline at a constant level during the verify operation.

In certain embodiments, the nonvolatile memory device is a flash memory device, such as a multi-level cell flash memory device.

In certain embodiments, the method further comprises applying different program voltages to selected bitlines connected to the selected memory cells based on the respective regions of the selected memory cells.

In certain embodiments, the method further comprises applying the program voltage to the selected wordline with an incrementally increased level during successive iterations of an incremental step pulse programming loop.

In certain embodiments, the incremental step pulse programming loop comprises a program operation for applying the program voltage to the selected wordline and the verify operation.

In certain embodiments, the verify operation comprises pre-charging a sense node and a bitline, performing a develop operation of the sense node and the bitline while the sense node and the bitline are coupled together, and sensing data of a selected memory cell connected to the bitline by sensing the voltage of the sense node. In certain embodiments, sensing of the data of the selected memory cell connected to the bitline comprises sensing the voltage of the sense node several times during one develop operation. In certain embodiments, sensing the data of the selected memory cell connected to the bitline comprises sensing the voltage of the sense node one time during one develop operation. In certain embodiments, pre-charging the sense node is performed simultaneously with transmission of sensed data.

In certain embodiments, an upper most region among the at least three regions corresponds to memory cells having threshold voltages above a verify read voltage, and the method further comprises programming all of the memory cells above the verify read voltage using incremental step pulse programming.

In certain embodiments, performing the verify operation comprises detecting current flowing through the selected memory cells when the verify voltage is applied to the selected wordline at a first sensing time, and detecting current flowing through the selected memory cells when the verify voltage is applied to the selected wordline at a second sensing time.

In certain embodiments, the method further comprises comparing the current flowing through the selected memory cells at the first sensing time with a first reference current to distinguish selected memory cells having threshold voltages in a first range from selected memory cells having threshold voltages above the first range.

In certain embodiments, the method further comprises comparing the current flowing through the selected memory cells at the second sensing time with a second reference current to distinguish selected memory cells having threshold voltages in a second range above than the first range from selected memory cells having threshold voltages in a third range above the second range.

In certain embodiments, the method further comprises during a program operation, applying a program inhibit voltage to bitlines connected to the selected memory cells within the third range and applying a ground voltage to bitlines connected to selected memory cells within the first range.

BRIEF DESCRIPTION OF THE DRAWINGS

Embodiments of the inventive concept will be more clearly understood from the following detailed description taken in conjunction with the accompanying drawings. In the drawings, like reference numerals denote like features.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

Figure 1:
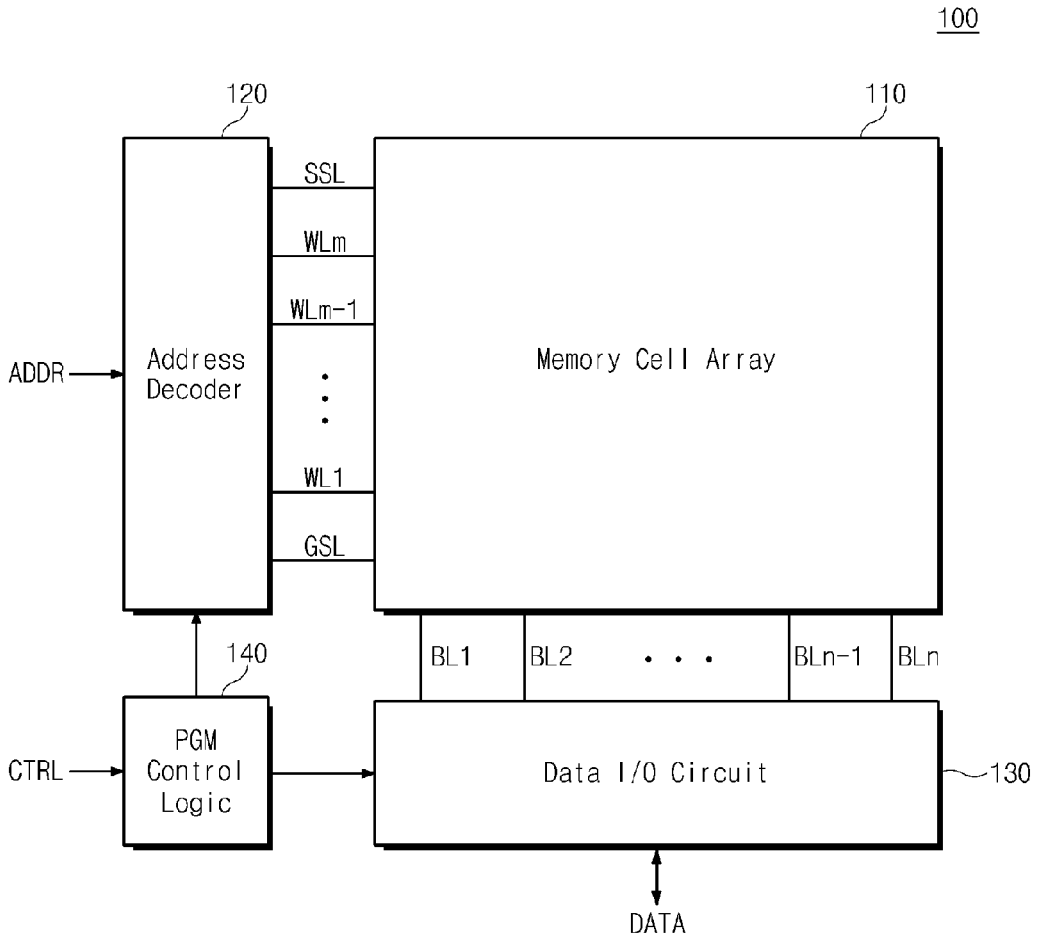
FIG. 1 is a block diagram of a flash memory device according to an embodiment of the inventive concept.

FIG. 1 is a block diagram of a flash memory device 100 according to an embodiment of the inventive concept.

Referring to FIG. 1, flash memory device 100 comprises a memory cell array 110, an address decoder 120, a data input/output (I/O) circuit 130, and a program control logic circuit 140.

Memory cell array 110 comprises a plurality of memory cells arranged in rows and columns. The memory cells in memory cell array 110 are connected to address decoder 120 via wordlines WL1 through WLm (collectively, wordlines WL) and to data I/O circuit 130 via bitlines BL1 through BLn (collectively, bitlines BL). Additionally, each row of memory cells in memory cell array 110 is connected to a corresponding one of wordlines WL.

The memory cells in memory cell array 110 may comprise single-level cells (SLCs) storing one bit of data, and/or multilevel cells (MLCs) storing more than one bit of data. A group of SLCs connected to the same wordline may store a single page of data scheme, while a group of MLCs connected to the same wordline may constitute multiple pages of data.

Address decoder 120 is connected to memory cell array 110 via wordlines WL1 through WLm. Program control logic circuit 140 controls address decoder 120. Address decoder 120 receives an address ADDR from an external device. Address ADDR comprises a row address and a column address.

Address decoder 120 decodes the row address and selects one of wordlines WL based on the decoded row address. Address decoder 120 also decodes the column address and transfers the decoded column address to data I/O circuit 130. Data I/O circuit 130 selects bitlines BL based on the decoded column address.

Program control logic circuit 140 controls data I/O circuit 130. Data I/O circuit 130 is connected to memory cell array 110 via bitlines BL. Data I/O circuit 130 receives data from the external device and stores the received data in memory cell array 110. Data I/O circuit 130 also reads data stored in memory cell array 110 and transfers the read data to the external device.

In some embodiments, data I/O circuit 130 comprises a column selection gate, a page buffer, and a data buffer. In some embodiments, data I/O circuit 130 comprises a column selection gate, a write driver, a sense amplifier, and a data buffer.

Program control logic circuit 140 operates in response to an external control signal CTRL. Program control logic circuit 140 controls data I/O circuit 130 and address decoder 120. In some embodiments, program control logic circuit 140 controls a sensing time used to sense threshold voltages of memory cells in a program verify operation.

Prior to an ISPP operation, a step voltage is applied to a selected wordline to bring the threshold voltage distribution of memory cells to a target voltage. This operation prior to an ISPP operation is called a convergence program operation. Following the convergence program operation, an ISPP operation is performed to program the threshold voltages of the memory cells above a verify voltage.

Memory cells have a wider threshold voltage distribution after the convergence program operation than after the ISPP operation. The ISPP operation is performed after the convergence program operation to reduce the wide threshold voltage distribution of the memory cells. The resulting narrower threshold voltage distribution ensures a sufficient read margin for performing reliable read operations.

To narrow the threshold voltage distribution, the ISPP operation provides a program voltage that increases by a predetermined step (ΔV) in successive loop iterations. In the ISPP operation, multiple loops are performed, where each loop comprises a program step, where a program voltage is applied to selected memory cells, and a verify step, where a verify operation is performed to determine whether the selected memory cells have been programmed to a desired threshold voltage. Multiple loops are performed using an increased program voltage in successive loops.

The voltage step size (ΔV) must be small enough to secure a sufficient read margin. However, as the voltage step size decreases, the number of loops needed to program the memory cells tends to increase. As a result, programming speed tends to suffer. This limitation may be addressed, however, by using an ISPP method comprising a two-step verify operation, as described below.

Figure 2:
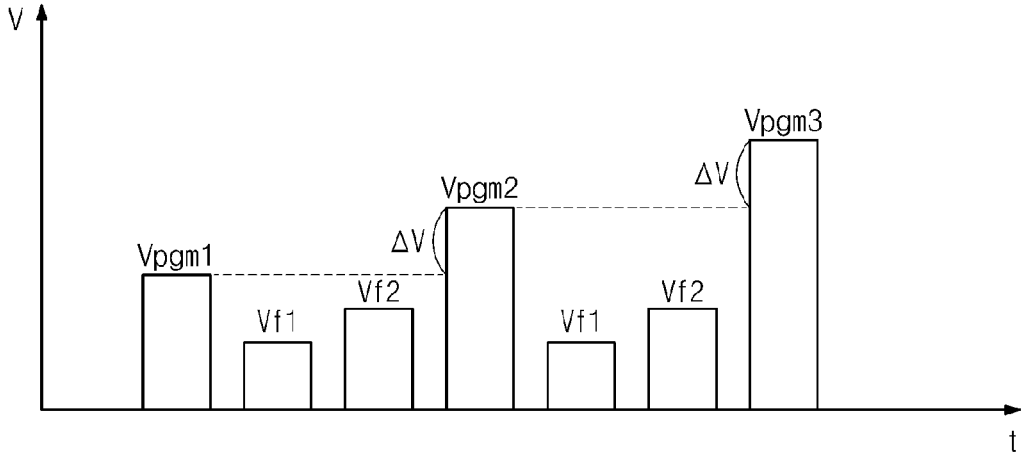
FIG. 2 is a voltage diagram illustrating program voltages and verify voltages in an ISPP method comprising a two-step verify operation.

FIG. 2 illustrates program voltages and verify voltages in an ISPP method comprising a two-step verify operation. In FIG. 2, the horizontal axis represents time and the vertical axis represents the voltage levels of program voltages and verify voltages.

In the ISPP method of FIG. 2, a program voltage Vpgm1 is applied to selected memory cells via a wordline. Next, verify voltages Vf1 and Vf2 with different voltage levels are applied to the selected memory cells via the wordline. This process is then repeated with program voltage incremented by ΔV and verify voltages Vf1 and Vf2 remaining the same.

Using this method, with a two-step verify operation, convergence-programmed memory cells are divided into three regions according to their threshold voltages. The three regions include memory cells with threshold voltages less than verify voltage Vf1, those with threshold voltages between verify voltages Vf1 and Vf2, and those with threshold voltages greater than verify voltage Vf2.

Figure 3:
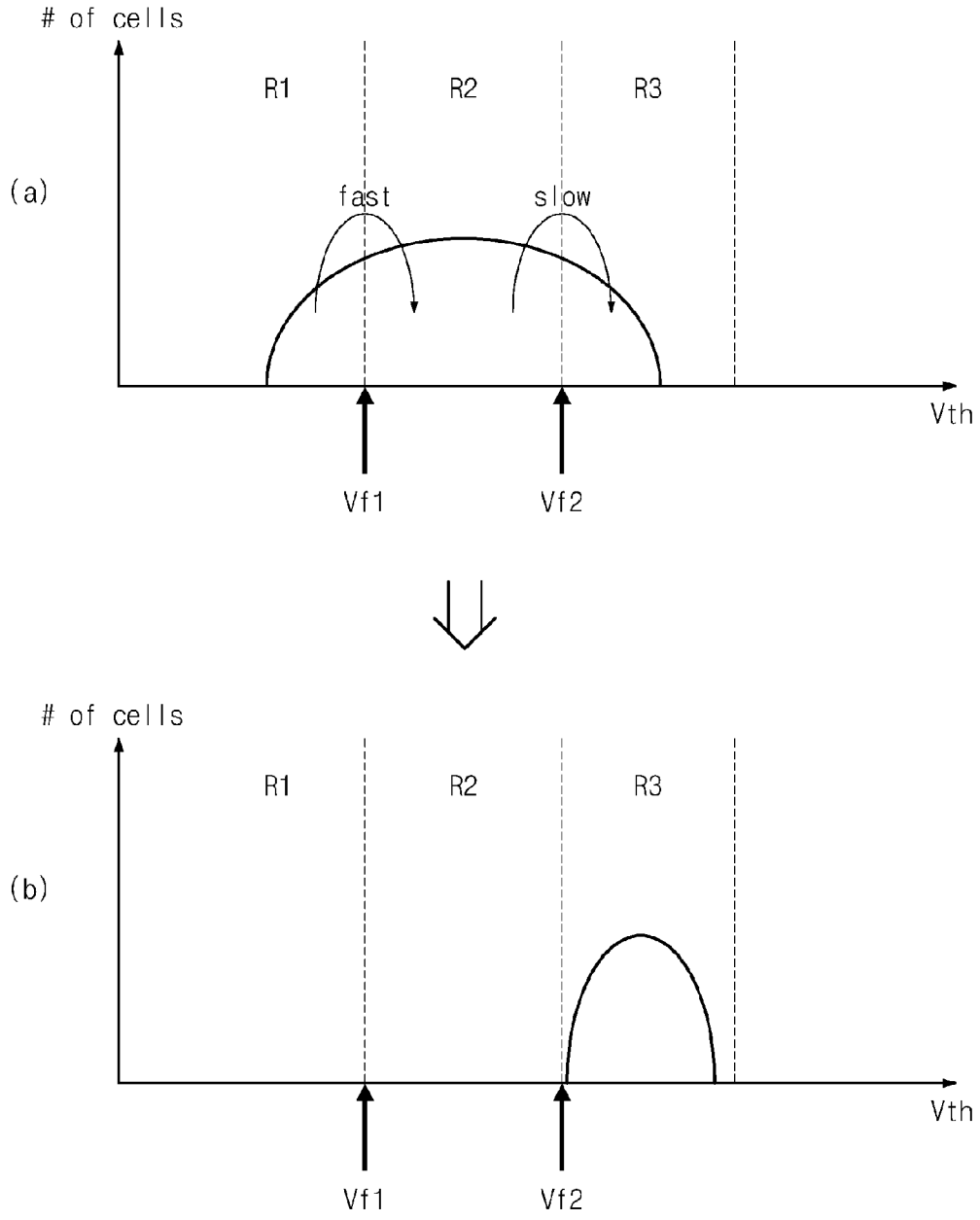
FIG. 3(a) is a diagram illustrating a division of memory cell threshold voltages into three different regions according to different verify voltages.
FIG. 3(b) is a diagram illustrating a threshold voltage distribution of memory cells after a program operation.

FIG. 3 is a threshold voltage diagram illustrating an ISPP method with a two-step verify operation. In FIG. 3, the horizontal axis represents the threshold voltage distribution of memory cells and the vertical axis represents the number of memory cells. FIG. 3(a) illustrates the division of memory cells into three regions according to different verify voltages after a convergence program operation. FIG. 3(b) illustrates a threshold voltage distribution of memory cells after an ISPP program operation.

Referring to FIG. 3(a), verify voltages Vf1 and Vf2 are applied to memory cells through a wordline. Verify voltage VF1, which has a relatively lower voltage level, will be referred to as first verify voltage Vf1, and verify voltage VF2, which has a relatively higher voltage level, will be referred to as second verify voltage Vf2.

A region of memory cells with a threshold voltage lower than first verify voltage Vf1 will be referred to as a first region R1. A region of memory cells with a threshold voltage higher than first verify voltage Vf1 and lower than second verify voltage Vf2 will be referred to as a second region R2. A region of memory cells with a threshold voltage higher than second verify voltage Vf2 will be referred to as a third region R3.

In a first verify operation, memory cells in first region R1 are distinguished from those in second or third regions R2 and R3 using first verify voltage Vf1. In a second operation, memory cells in second region R2 are distinguished from those in third region R3 using second verify voltage Vf2. Thereafter, an ISPP method is used to program memory cells to a final state using a two-step verify operation, as described below.

In the first verify operation, a power supply voltage Vcc is applied to a bitline corresponding to a string of memory cells. The bitline receiving power supply voltage Vcc is floated. Applying power supply voltage Vcc to float a bitline will be referred to as a bitline pre-charge (BL pre_charge) operation. Next, first verify voltage Vf1 is applied to memory cells through a selected wordline. A read voltage Vread (e.g., about 4.5V) is applied to unselected wordlines.

In the first verify operation, memory cells in first region R1 are turned on by first verify voltage Vf1 and memory cells in second and third regions R2 and R3 are not turned on by first verify voltage Vf1. Thus, first verify voltage Vf1 is used to distinguish memory cells in first region R1 from memory cells in second and third regions R2 and R3.

In the second verify operation, a bitline pre-charge operation is again performed on the memory cells that the first verify operation determined to be in second region R2 or third region R3. Also, second verify voltage Vf2 is applied through a selected wordline to memory cells. Read voltage Vread is applied to memory cells connected to unselected wordlines.

In the second verify operation, memory cells in second region R2 are turned on and memory cells in third region R3 are not turned on. Thus, second verify voltage Vf2 is used in the second verify operation to distinguish memory cells in second region R2 from memory cells in third region R3.

Once memory cells have been divided into regions R1 through R3, memory cells in the different regions can be supplied with different bitline voltages during program operations to control the speed of programming, as described below.

First, a bitline bias operation is performed. In the bitline bias operation, a first voltage (e.g., a ground voltage 0V) is applied to bitlines of memory cells in first region R1; a second voltage higher than the first voltage but lower than a program inhibit voltage (e.g., 1V) is applied to bitlines of memory cells in second region R2; and a third voltage higher than the second voltage (e.g., a program inhibit voltage Vcc) is applied to memory cells in region R3.

Because memory cells in regions R1 through R3 receive different bitline voltages, they tend to become programmed at different rates. In particular, memory cells in region R1 tend to become programmed more dramatically at each step of an ISPP operation due to the lower bitline voltage. This can be explained by the fact that applying a relatively higher bitline voltage to memory cells in second and third regions R2 and R3 reduces the voltage applied between a control gate and a channel of memory cells, which tends to reduce the amount of charge transferred to respective floating gates.

After the above program operation, first verify voltage Vf1 and second verify voltage Vf2 are again applied to the memory cells as described above and the memory cells are again divided into regions R1 through R3 based on whether or not they are turned on in response to first and second verify voltage Vf1 and Vf2. Thereafter, programming operations are again performed on the memory cells, using different bitline voltages for memory cells in different regions, as discussed above. The process comprising programming operations and two step verify operations is repeated in successive loops until all of the memory cells have a threshold voltage higher than second verify voltage Vf2. In some embodiments, the wordline voltage may be incremented in each successive loop, and in other embodiments, the wordline voltage may remain the same in each loop.

FIG. 3(b) illustrates a threshold voltage distribution after all of the memory cells have been successfully programmed to have threshold voltages above second verify voltage V2. As illustrated by FIG. 3(b), the above described method can program memory cells with a relatively narrow threshold voltage distribution by programming memory cells in different regions using different bitline voltages.

The memory cells programmed by the above program method tend to be programmed faster than those programmed using conventional ISPP methods. In some embodiments, this is because a larger step size (ΔV) is used compared with conventional ISPP methods, allowing the total number of program loops to be reduced.

One drawback of the above method is that the requirement to use two different verify voltages tends to increase programming time. The following embodiments described below address this drawback.

Figure 4:
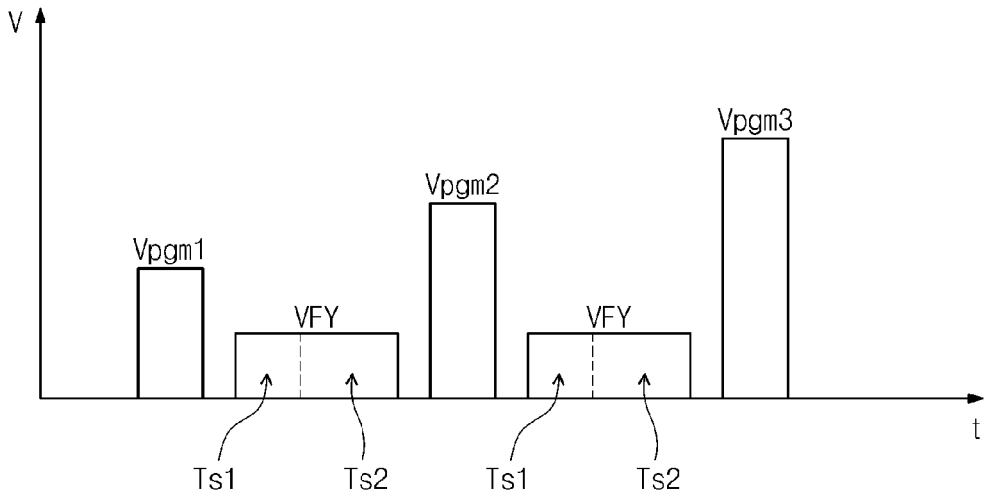
FIG. 4 is a voltage diagram illustrating program voltages and verify voltages used in an ISPP method comprising a two-step verify operation.

FIG. 4 illustrates program voltages and verify voltages in an ISPP method comprising a two-step verify operation according to an embodiment of the inventive concept. In FIG. 4, the horizontal axis represents a time and the vertical axis represents the voltage levels of programs voltages and verify voltages.

Referring to FIG. 4, a program voltage Vpgm1 is applied to selected memory cells via a selected wordline. Thereafter, a verify voltage VFY is applied to the memory cells via the selected wordline. Unlike the method of FIG. 2, verify voltage VFY in FIG. 4 maintains a constant voltage level during the two-step verify operation.

In FIG. 4, a verify operation is performed two times while verify voltage VFY maintains a constant voltage level. A first verify operation is performed at a first sense time Ts1, and a second verify operation is performed at a second sense time Ts2 at a predetermined interval from first sense time Ts1.

In the first verify operation, current flowing through selected memory cells is compared with a first reference current Is1, and in the second verify operation, current flowing through the selected memory cells is compared with a second reference current Is2. Because memory cells in region R1 have lower threshold voltages than the memory cells in regions R2 and R3, these memory cells will tend to have greater current compared with memory cells in regions R2 and R3 when verify voltage VFY is applied thereto. In other words, memory cells with lower threshold voltages will tend to have higher current. Accordingly selected memory cells with current greater than reference current Is1 will be assigned to region R1 after the first verify operation. Similarly, selected memory cells with current greater than reference current Is2 will be assigned to region R2 after the second verify operation. The remaining selected memory cells are assigned to region R3.

The process of FIG. 4 is repeated using successively increasing program voltages Vpgm2, Vpgm3, and so on. Because verify voltage remains the same during the two verify operations, the method of FIG. 3 make take less time compared with them method of FIG. 2.

Figure 5:
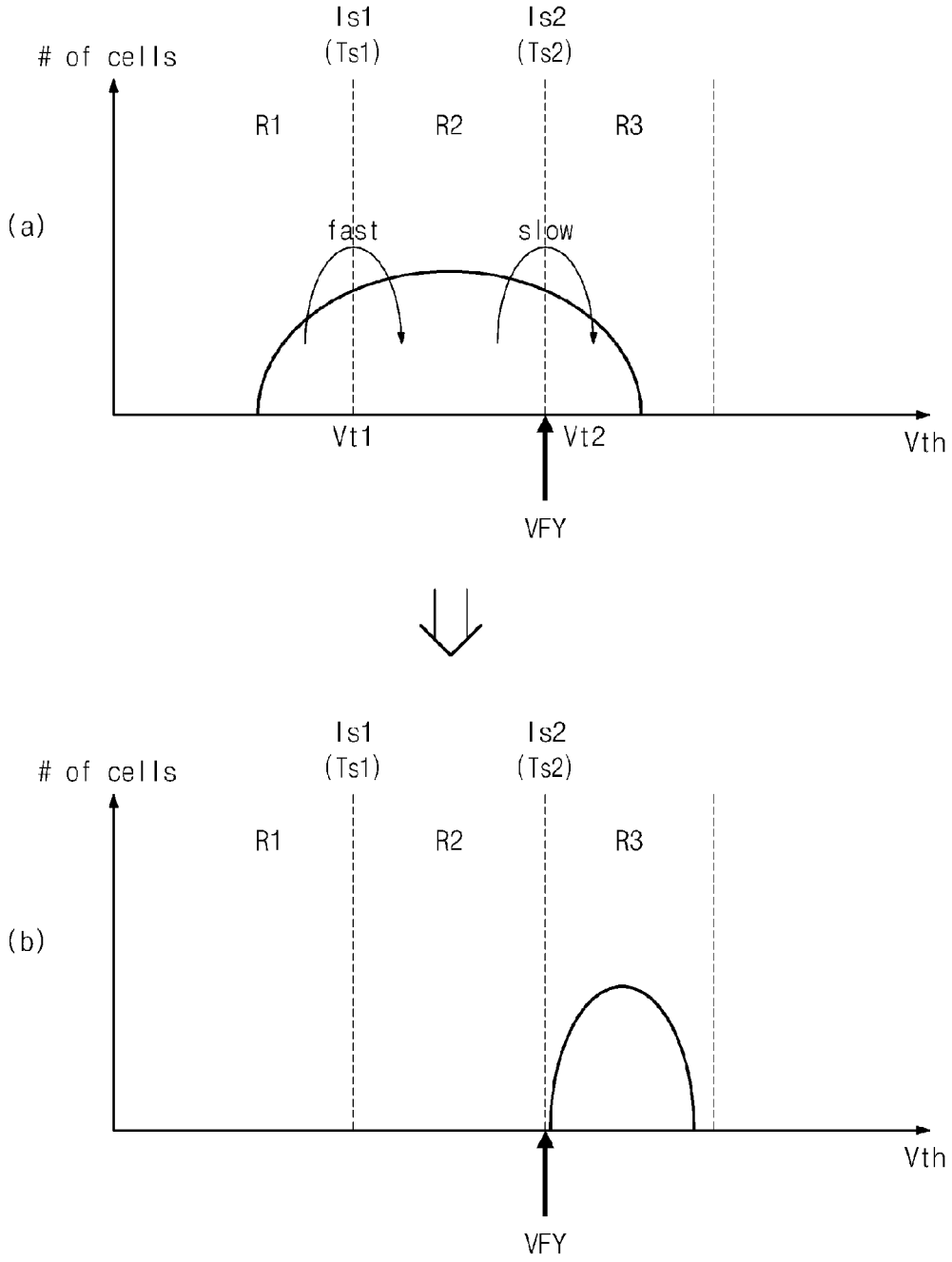
FIG. 5(a) is a diagram illustrating a division of memory cell threshold voltages into three different regions according to different amounts of current flowing therethrough during different verify operations.
FIG. 5(b) is a diagram illustrating a threshold voltage distribution of memory cells after a program operation.

FIG. 5 is a threshold voltage diagram illustrating an ISPP method comprising a two-step verify operation according to an embodiment of the inventive concept. In FIG. 5, the horizontal axis represents the threshold voltage distribution of memory cells and the vertical axis represents the number of memory cells. FIG. 5(a) illustrates the division of memory cells into three regions according to different amounts of current flowing therethrough in different verify operations. FIG. 5(b) illustrates the threshold voltage distribution of memory cells after completion of the program operation.

Referring to FIG. 5(a), memory cells are divided into first region R1, second region R2 and third region R3 based on the amount of current flowing therethrough at different sensing times. Verify voltage VFY is applied to selected memory cells at a constant level through the selected wordline. Meanwhile, a different voltage is applied to unselected wordlines.

The memory cells are divided into first through third regions R1 through R3 by comparing the current flowing through the memory cells with reference current Is1 at first sense time Ts1, and comparing the memory cells with reference current Is2 at second sense time Ts2, as described above. The process of distinguishing memory cells in first region R1 from those in second and third regions R2 and R3 using first reference current Is1 will be referred to as a first verify operation, and the process of distinguishing memory cells in second region R2 from those in third region R3 using second reference current Is2 will be referred to as a second verify operation.

The method of FIGS. 4 and 5 eliminates the requirement of performing two verify operations with different verify voltages. This also eliminates the need to perform two bitline pre-charge operations. Thus, the method of FIGS. 4 and 5 may be save time compared with the method of FIGS. 2 and 3.

In the first verify operation of FIG. 5, a bitline pre-charge operation is performed. The verify voltage VFY is applied to the selected memory cells via the selected wordline. Thereafter, the second verify operation is performed with verify voltage VFY at the same level. Throughout the first and second verify operations, a different voltage (e.g., a read voltage Vread) is applied to unselected wordlines.

Once memory cells have been divided into the first through third regions R1 through R3, a program operation may be performed on those cells using an incrementally increasing wordline voltage, and bitline voltages that vary based on the region of each memory cell so that memory cells in region R1 are programmed at a different rate than those in region R2, and so on. The process of varying bitline voltages based on regions R1 through R3 was described above in relation to FIG. 3. Thus, additional explanation of this process will be omitted to avoid redundancy.

FIG. 5(b) shows the threshold voltage distribution of selected memory cells after all memory cells in first through third regions R1 through R3 have been successfully programmed with threshold voltages higher than verify voltage VFY. This threshold voltage distribution is narrow enough to ensure an adequate sensing margin, as described above in relation to FIG. 3(b).

Memory cells may be programmed faster using the method of FIGS. 4 and 5 compared with the method of FIGS. 2 and 3. This is because the method of FIGS. 4 and 5 distinguishes between memory cells in regions R1 through R3 using a constant verify voltage. This, eliminates the time needed to vary the level of the verify voltage.

Additionally, the method of FIGS. 4 and 5 performs the pre-charge operation only one time, whereas the program method of FIGS. 2 and 3 performs the pre-charge operation two times. Thus, the method of FIGS. 4 and 5 eliminates the time required to perform the additional pre-charge operation.

Figure 6:
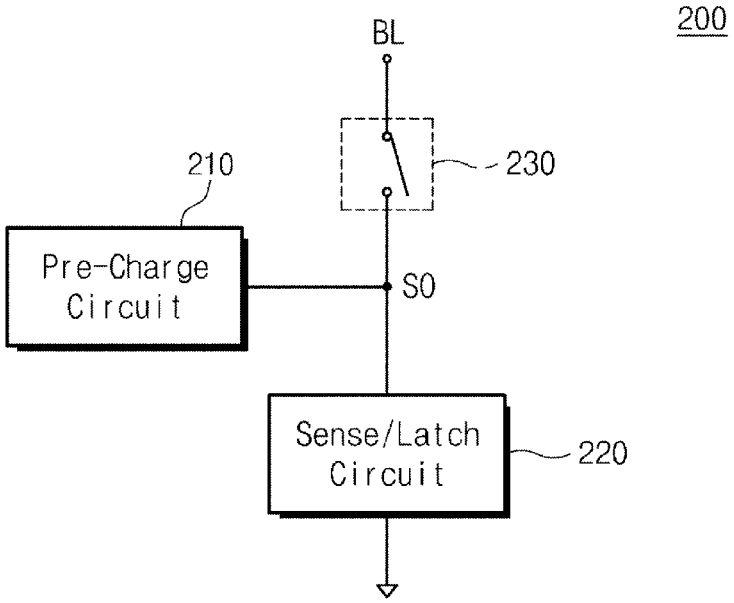
FIG. 6 is a block diagram of a page buffer according to an embodiment of the inventive concept.

FIG. 6 is a block diagram of a page buffer 200 according to an embodiment of the inventive concept. An operation for comparing the voltage level of a sense node with a reference voltage to sense data of memory cells will be described with reference to FIG. 6.

Referring to FIG. 6, page buffer 200 comprises a bitline BL, a pre-charge circuit 210, and a sense/latch circuit 220. A sense node S0 is located between pre-charge circuit 210 and sense/latch circuit 220. A switch 230 is located between sense node S0 and bitline BL. Switch 230 may be a transistor.

Pre-charge circuit 210 pre-charges bitline BL and sense node S0 before verifying selected memory cells. After bitline BL and sense node S0 are pre-charged, a verify voltage VFY is applied to a selected wordline and a different voltage is applied to unselected wordlines.

At this point, pre-charge circuit 210 interrupts the supply of pre-charge power to bitline BL and sense node S0. Switch 230 opens a current path between bitline BL and sense node S0. This is similar to the effect of shorting bitline BL and sense node S0 to each other while interrupting the supply of external power. This will be referred to as a coupling state between bitline BL and sense node S0.

A develop operation is performed while bitline BL and sense node S0 are coupled together. In the develop operation, the charge pre-charged in bitline BL leaks to a ground node through the channel of a memory cell. When the charge pre-charged in bitline BL leaks to the ground node, the corresponding charge is supplied from sense node S0 to bitline BL because bitline BL and sense node S0 are substantially shorted to each other.

Consequently, after the develop operation is performed, the voltage level of sense node S0 is compared with a reference voltage to sense data of memory cells. This is because the voltage level of a sense node S changed when the charge corresponding to the charge of bitline BL that was leaked to sense node S0 was supplied from sense node S0 to bitline BL.

An operation for sensing the voltage level of sense node S0 to sense data of the memory cells is performed faster than sensing the voltage level of bitline BL to sense data of the memory cells. This is because the voltage level of sense node S0 changes faster than the voltage level of bitline BL when the capacitance of sense node S0 is smaller than the capacitance of bitline BL. This will be described in further detail with reference to FIG. 7.

As described above, the voltage level of sense node S0 is compared with a reference voltage Vref to sense data of the memory cells. In this case, a data error may occur if a two-step verify operation is performed at different verify times in one develop operation. In another embodiment of the inventive concept, a pre-charge operation of sense node S0 is performed twice to prevent such a data error. This will be described in further detail with reference to FIG. 8.

Figure 7:
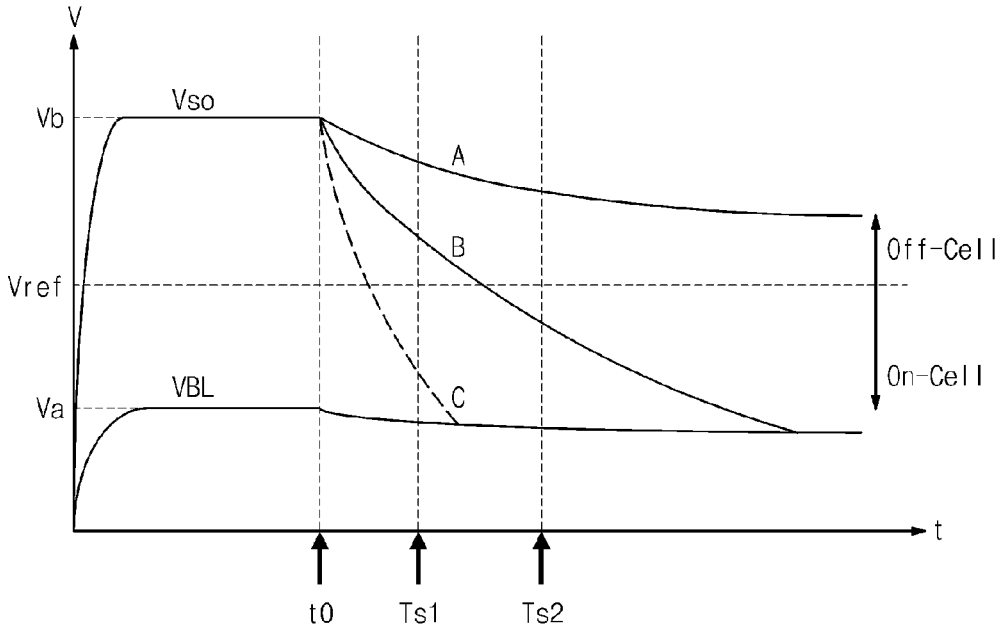
FIG. 7 is a timing diagram of a program method comprising a two-step verify operation according to an embodiment of the inventive concept.

FIG. 7 is a timing diagram of a program method comprising a two-step verify operation according to an embodiment of the inventive concept. In FIG. 7, the horizontal axis represents a time and the vertical axis represents a voltage level.

In FIG. 7, 'Va' denotes a voltage pre-charged in the bitline. 'Vb' denotes a voltage pre-charged in sense node S0. 'Vref' denotes a reference voltage in the page buffer. A develop operation time after completion of a pre-charge operation is denoted by 't0'. 'A' denotes a memory cell with a threshold voltage corresponding to third region R3 of FIG. 5. 'B' denotes a memory cell with a threshold voltage corresponding to second region R2 of FIG. 5. 'C' denotes a memory cell with a threshold voltage corresponding to first region R1 of FIG. 5.

FIG. 7 illustrates a voltage change of bitline BL and a voltage change of sense node S0 in the develop operation.

First, pre-charge circuit 210 pre-charges bitline BL and sense node S0. In this case, a voltage level $V_{BL}$ pre-charged in bitline BL will be lower than a voltage level $V_{SO}$ pre-charged in sense node S0. In this case, the capacitance of bitline BL will be larger than the capacitance of sense node S0. Thereafter, a verify voltage VFY is applied through a selected wordline to selected wordlines. Verify voltage VFY maintains a constant level during the develop operation. A read voltage Vread is applied to unselected memory cells through an unselected wordline.

A develop operation is performed at time t0. As described with reference to FIG. 6, the develop operation is performed while bitline BL and sense node S0 are coupled together. In the develop operation, when the charge pre-charged in bitline BL leaks, the corresponding charge will be supplied from sense node S0 to bitline BL. Thus, the voltage level pre-charged in sense node S0 will decrease in proportion to the charge supplied from sense node S0 to bitline BL.

The currents flowing in the memory cells depend on the threshold voltage distributions of the memory cells. Memory cells with a lower threshold voltage will have a relatively large cell current, and memory cells with a higher threshold voltage have a relatively small cell current. That is, the current flowing in the memory cell is inversely proportional to the threshold voltage level.

When the current flowing in the memory cell is large, the charge pre-charged in bitline BL of the memory cell leaks rapidly. In this case, the charge pre-charged in sense node S0 is rapidly supplied to bitline BL. This is because the develop operation is performed while sense node S0 and bitline BL are coupled together. Thus, the voltage level of sense node S0 decreases rapidly. That is, the voltage level of sense node S0 of the memory cells with a low threshold voltage decreases faster than the voltage level of sense node S0 of the memory cells with a high threshold voltage.

Because memory cell 'A' has the highest threshold voltage, the voltage level pre-charged in sense node S0 corresponding to memory cell 'A' decreases more slowly than the voltage levels pre-charged in sense nodes S0 corresponding to memory cells 'B' and 'C'.

Because memory cell 'C' has the lowest threshold voltage, the voltage level pre-charged in sense node S0 corresponding to memory cell 'C' decreases faster than the voltage levels pre-charged in sense nodes S0 corresponding to memory cells 'A' and 'B'.

Because memory cell 'B' has a lower threshold voltage than memory cell 'A' and higher than memory cell 'C', the voltage level pre-charged in sense node S0 corresponding to memory cell 'B' decreases faster than the voltage level pre-charged in sense nodes S0 corresponding to memory cell 'A' and slower than that corresponding to memory cell 'C'.

First, whether the memory cells with a low threshold voltage are turned on or turned off can be determined at first sense time Ts1. This is because the voltage of sense node S0 in the memory cells with a low threshold voltage decreases faster than the voltage of sense node S0 in the memory cells with a high threshold voltage.

At first sense time Ts1, the voltage of sense node S0 in memory cells 'A' and 'B' is higher than reference voltage Vref. The voltage of sense node S0 in memory cell 'C' is lower than reference voltage Vref. Thus, memory cells A and B are determined to be turned off, and memory cell 'C' is determined to be turned on. Therefore, memory cell 'C' is determined to have a lower threshold voltage than memory cells 'A' and 'B' (e.g., first region R1 of FIG. 5).

Whether the memory cells with high threshold voltages are turned on or turned off can be determined at second sense time Ts2. This is because the voltage of sense node S0 in the memory cells with a high threshold voltage decreases more slowly than the voltage of sense node S0 in the memory cells with a low threshold voltage.

At second sense time Ts2, the voltage of sense node S0 in memory cell 'A' is higher than reference voltage Vref. The voltage of sense node S0 in memory cell 'B' is lower than reference voltage Vref. Thus, memory cell 'A' is determined to be turned off, and memory cell 'B' is determined to be turned on. Therefore, memory cell B is determined to have a lower threshold voltage than memory cell 'A' (e.g., third region R3 of FIG. 5).

As described above, by using different sense times, embodiments of the inventive concept can determine which of first, second, and third regions R1, R2, and R3 the memory cells are in. Because verify voltage VFY maintains a constant level, it is unnecessary to vary the verify voltage. Thus, embodiments of the inventive concept can reduce the program time by the time taken to vary the verify voltage.

Also, some embodiments of the inventive concept perform the bitline pre-charge operation only one time, which can also reduce the time taken to perform the bitline pre-charge operations.

Some embodiments of the inventive concept perform the develop operation while sense node S0 and bitline BL are coupled together. In these embodiments, the time taken to verify the threshold voltage of the memory cells may be shorter than in embodiments performing the develop operation while sense node S0 and bitline BL are not coupled together. This may be true especially where the capacitance of sense node S0 is smaller than the capacitance of bitline BL.

Meanwhile, in the embodiment of FIG. 7, it has been assumed that the two-step verify operation is performed after the pre-charge operation of sense node S0 and bitline BL is performed once. This is merely an example and is not intended to limit the inventive concept. In other embodiments of the inventive concept, a pre-charge operation of sense node S0 may be performed twice. This will be described below with reference to FIG. 8.

Figure 8:
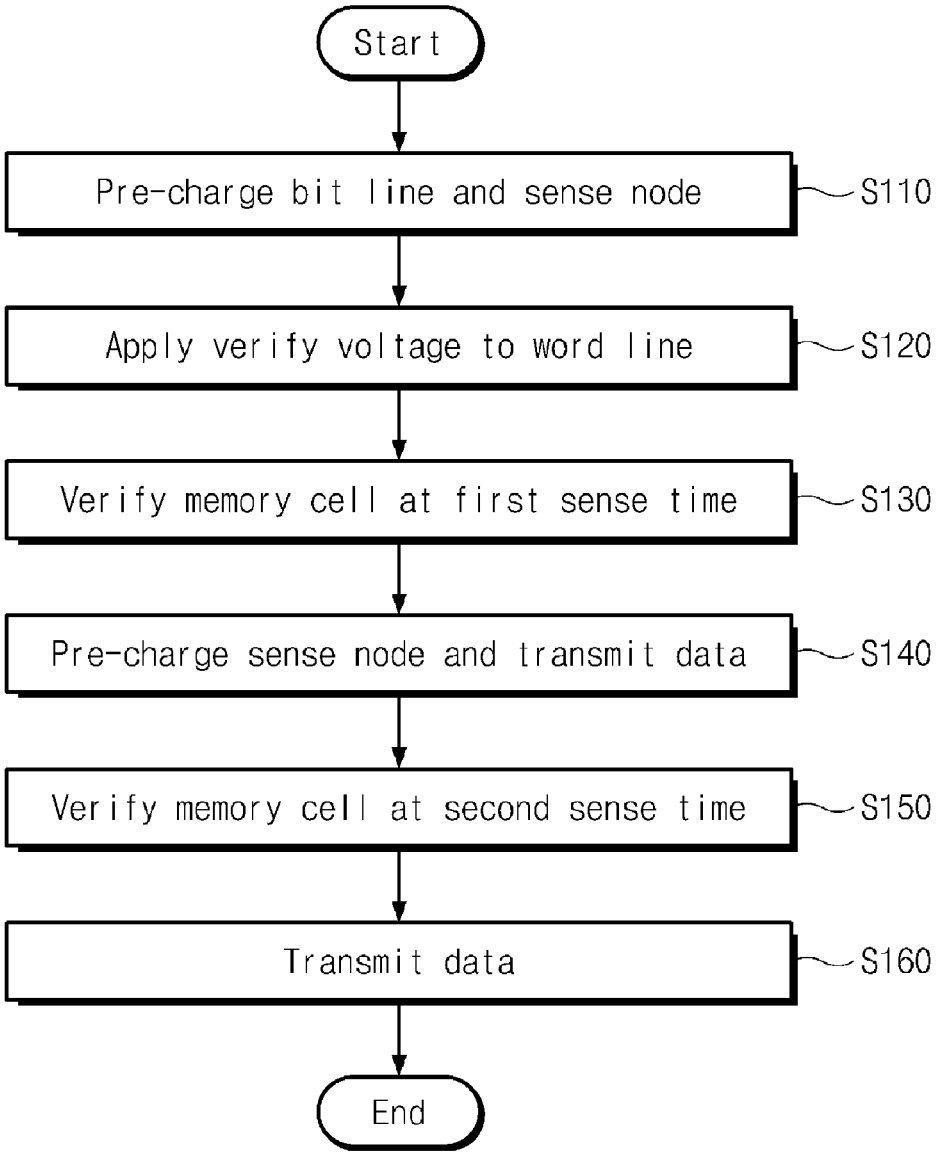
FIG. 8 is a flowchart illustrating a two-step verify operation according to another embodiment of the inventive concept.

FIG. 8 is a flow chart illustrating a two-step verify operation according to another embodiment of the inventive concept.

In the embodiment of FIG. 8, the voltage level of sense node S0 is compared with reference voltage Vref to sense data from selected memory cells.

In step S110, bitline BL and sense node S0 are pre-charged. This operation is described above with reference to FIGS. 6 and 7, and thus additional description will be omitted to avoid redundancy.

In step S120, verify voltage VFY is applied to selected memory cells via the selected wordline. Verify voltage VFY maintains a constant level in the first verify operation and the second verify operation, as described, for instance, in relation to FIG. 5.

In step S130, whether the selected memory cells are turned on or turned off is determined at first sense time Ts1. This is similar to the first verify operation of FIG. 5. However, in this case, as illustrated in FIGS. 6 and 7, the voltage level of sense node S0 is compared with reference voltage Vref to determine whether the memory cells are turned on or turned off.

In step S140, the data of the memory cells sensed in step S130 are transmitted to an external device simultaneously with a sense node pre-charge (S0 pre_charge) operation. That is, the data of the selected memory cells determined to be in first region R1 and the data of the selected memory cells determined to be in second region R2 or third region R3 are transmitted to the external device through sense/latch circuit 220 of FIG. 6.

As illustrated in FIGS. 6 and 7, the charge corresponding to the charge of bitline BL leaked to the ground node is supplied through sense node S0 to bitline BL. Thus, the voltage of bitline BL can maintain a nearly constant level and pre-charge circuit 210 need not pre-charge the bitline. However, if the voltage level of bitline BL has changed, pre-charge circuit 210 may pre-charge bitline BL and sense node S0 simultaneously.

In step S150, whether the memory cells are turned on or turned off is determined at second sense time Ts2. This is similar to the second verify operation of FIG. 5. In other words, in step S150, it is determined whether memory cells determined not to be in first region R1 are in second region R2 or in third region R3. However, in this case, the voltage level of sense node S0 is compared with reference voltage Vref to determine whether the memory cells are turned on or turned off. Also, in this case, only one verify operation is performed in one develop operation.

In step S160, the data of the memory cells sensed in step S150 are transmitted to the external device.

Figure 9:
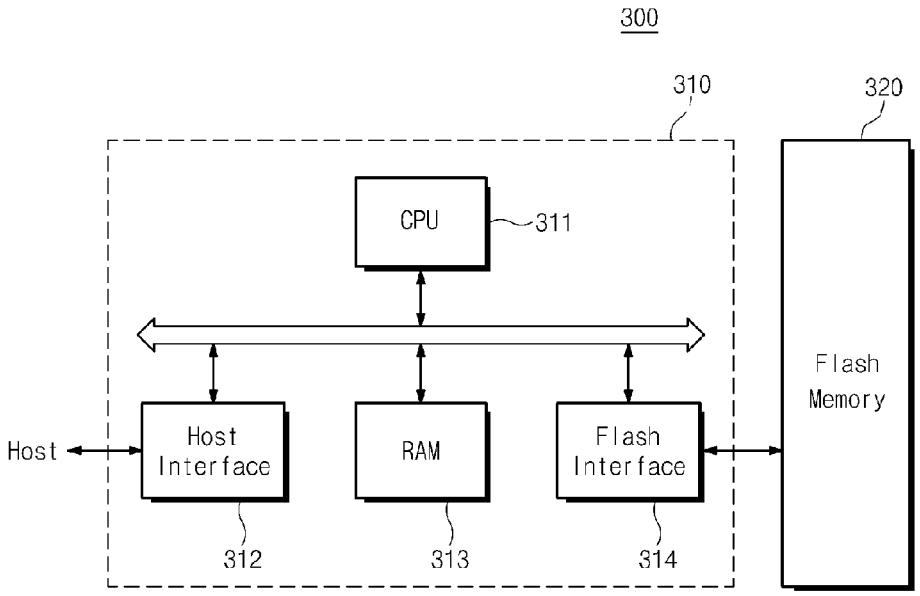
FIG. 9 is a block diagram of a semiconductor memory device using a programming method according to an embodiment of the inventive concept.

FIG. 9 is a block diagram of a semiconductor memory device 300 using a program method according to an embodiment of the inventive concept.

Referring to FIG. 9, semiconductor memory device 300 comprises a memory controller 310 and a flash memory 320. Examples of semiconductor memory device 300 include storage devices such as volatile memories or nonvolatile memory devices, such as memory cards (e.g., SDs and MMCs) and portable mobile storages (e.g., USB memories).

Memory controller 320 comprises a central processing unit (CPU) 311, a host interface 312, a random access memory (RAM) 313, and a flash interface 314.

Figure 10:
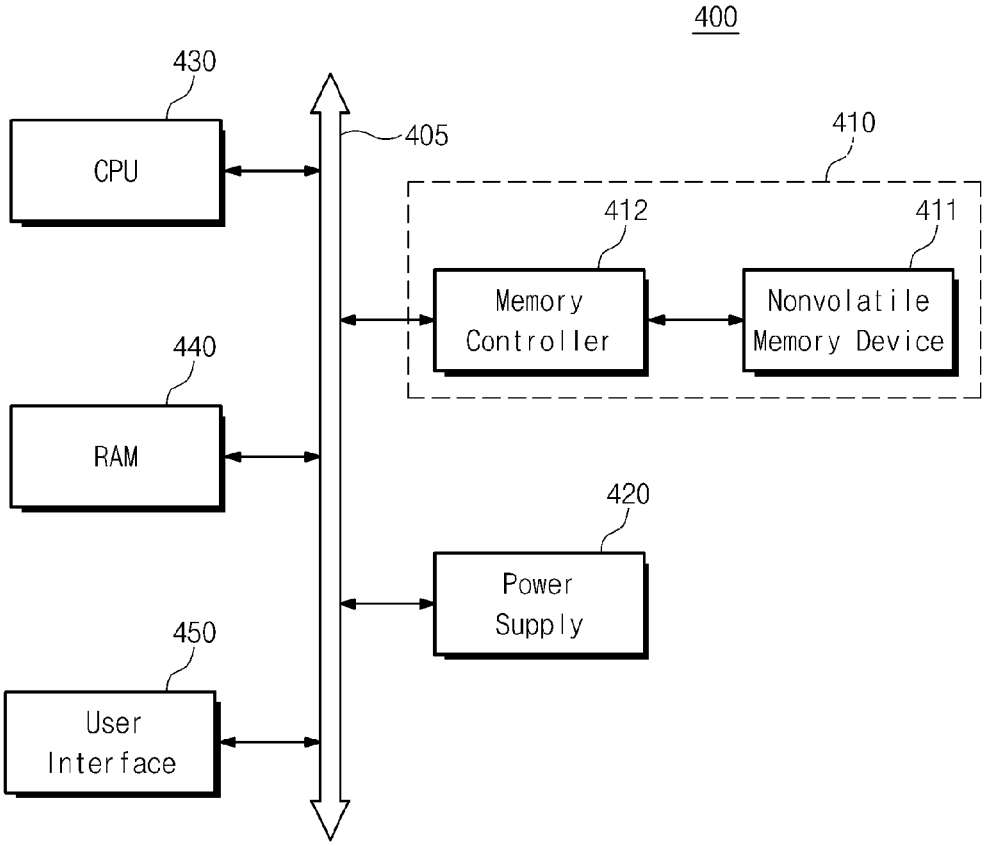
FIG. 10 is a block diagram of a user device using a programming method according to an embodiment of the inventive concept.

FIG. 10 is a block diagram of a user device 400 using a program method according to an embodiment of the inventive concept.

Referring to FIG. 10, user device 400 may be implemented as a personal computer (PC) or a portable electronic device such as a notebook computer, a portable phone, a personal digital assistant (PDA), or a camera.

User device 400 comprises a bus/power line 405, a memory system 410, a power supply 420, a CPU 430, a RAM 440, and a user interface 450. Memory system 410 comprises a non-volatile memory device 411 and a memory controller 412.

Memory controller 412 is connected to a host and nonvolatile memory device 411. Memory controller 412 transfers data, read from nonvolatile memory device 411, to the host and stores data, received from the host, in nonvolatile memory device 411.

Memory controller 412 may comprise a random access memory (RAM), a processing unit, a host interface, and a memory interface. The RAM may be used as a working memory of the processing unit. The processing unit may control an overall operation of memory controller 412. The host interface may implement a protocol for data exchange between the host and memory controller 412. For example, memory controller 412 may be configured to communicate with an external device (e.g., the host) through one of various interface protocols such as Universal Serial Bus (USB), Multimedia Card (MMC), Peripheral Component Interface (PCI), PCI-Express (PCI-E), Advanced Technology Attachment (ATA), Serial-ATA, Parallel-ATA, Small Computer System Interface (SCSI), ESDI (Enhanced Small Disk Interface), and Integrated Drive Electronics (IDE). The memory interface may interface with nonvolatile memory device 411. Memory controller 412 may further comprise an error correction block. The error correction block may be configured to detect and correct an error in data read from nonvolatile memory device 411.

Nonvolatile memory device 411 may comprise a memory cell array for storing data, a read/write circuit for reading or writing data in the memory cell array, an address decoder for decoding an address received from an external device and transferring the same to the read/write circuit, and a control logic circuit for controlling an overall operation of nonvolatile memory device 411.

Memory controller 412 and nonvolatile memory device 411 may be integrated into one semiconductor device. As an example, memory controller 412 and nonvolatile memory device 411 may be integrated into one semiconductor device to constitute a memory card. For example, memory controller 412 and nonvolatile memory device 411 may be integrated into one semiconductor device to constitute a PC card (e.g., Personal Computer Memory Card International Association (PCMCIA)), a compact flash card (CF), a smart media card (SM/SMC), a memory stick, a multimedia card (e.g., MMC, RS-MMC and MMCmicro), a SD card (e.g., SD, miniSD, and microSD), or a universal flash storage (UFS).

As another example, memory controller 412 and nonvolatile memory device 411 may be integrated into one semiconductor device to form a solid state disk/drive (SSD). When memory system 410 is used as an SSD, the operation speed of the host connected to the memory system 410 may increase dramatically.

As other examples, memory system 410 may be incorporated in PDAs, portable computers, web tablets, wireless phones, mobile phones, digital music players, and devices capable of transmitting or receiving information in wireless environments.

As other examples, nonvolatile memory device 411 or memory system 410 may be mounted in various types of packages. Examples of the packages of nonvolatile memory device 411 or memory system 410 include package on package (PoP), ball grid arrays (BGA), chip scale packages (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

[1. A method of programming a nonvolatile memory device, comprising:

applying a program voltage to a selected wordline to program selected memory cells; and performing a verify operation by applying a verify voltage to the selected wordline to determine the programming status of the selected memory cells, wherein the verify operation applies the verify voltage to the selected wordline at least two different times to divide the selected memory cells into at least three regions corresponding to different threshold voltage ranges.]

[2. The method of claim 1, wherein the verify voltage is applied to the selected wordline at a constant level during the verify operation.]

[3. The method of claim 1, wherein the nonvolatile memory device is a flash memory device.]

[4. The method of claim 1, wherein the nonvolatile memory device is a multi-level cell flash memory device.]

[5. The method of claim 1, further comprising:

applying different program voltages to selected bitlines connected to the selected memory cells based on the respective regions of the selected memory cells.]

[6. The method of claim 1, further comprising:

applying the program voltage to the selected wordline with an incrementally increased level during successive iterations of an incremental step pulse programming loop.]

[7. The method of claim 6, wherein the incremental step pulse programming loop comprises a program operation for applying the program voltage to the selected wordline and the verify operation.]

[8. The method of claim 1, wherein the verify operation comprises:

pre-charging a sense node and a bitline;

performing a develop operation of the sense node and the bitline while the sense node and the bitline are coupled together; and sensing data of a selected memory cell connected to the bitline by sensing the voltage of the sense node.]

[9. The method of claim 8, wherein sensing of the data of the selected memory cell connected to the bitline comprises sensing the voltage of the sense node several times during one develop operation.]

[10. The method of claim 8, wherein sensing the data of the selected memory cell connected to the bitline comprises sensing the voltage of the sense node one time during one develop operation.]

[11. The method of claim 8, wherein pre-charging the sense node is performed simultaneously with transmission of sensed data.]

[12. The method of claim 1, wherein an upper most region among the at least three regions corresponds to memory cells having threshold voltages above a verify read voltage, and the method further comprises programming all of the memory cells above the verify read voltage using incremental step pulse programming.]

[13. The method of claim 1, wherein performing the verify operation comprises:

detecting current flowing through the selected memory cells when the verify voltage is applied to the selected wordline at a first sensing time, and detecting current flowing through the selected memory cells when the verify voltage is applied to the selected wordline at a second sensing time.]

[14. The method of claim 13, further comprising:

comparing the current flowing through the selected memory cells at the first sensing time with a first reference current to distinguish selected memory cells having threshold voltages in a first range from selected memory cells having threshold voltages above the first range.]

[15. The method of claim 14, further comprising:

comparing the current flowing through the selected memory cells at the second sensing time with a second reference current to distinguish selected memory cells having threshold voltages in a second range above than the first range from selected memory cells having threshold voltages in a third range above the second range.]

[16. The method of claim 14, further comprising:

during a program operation, applying a program inhibit voltage to bitlines connected to the selected memory cells within the third range and applying a ground voltage to bitlines connected to selected memory cells within the first range.]

*17. A method of programming a nonvolatile memory device, comprising:*

*applying a first program voltage to a selected wordline to program selected memory cells included in the non-volatile memory device;*

*performing a verify operation by applying a verify voltage to the selected wordline and by applying a pre-charging voltage to at least one of selected bitlines connected to the selected memory cells to determine a programming status of the selected memory cells, the verify operation including a first verify operation and a second verify operation following the first verify operation, wherein the verify operation applies the verify voltage to the selected wordline at least two different times to divide the selected memory cells into at least three regions corresponding to different threshold voltage ranges, the at least three regions including a first region, a second region and a third region;*

*applying a second program voltage higher than the first program voltage to the selected wordline after the performing the verify operation; and*

*based on a result of the first verify operation and a result of the second verify operation, applying a bit-line bias to a first bitline among the selected bitlines during the applying the second program voltage to the selected wordline, the first bitline being connected to a first memory cell included in the second region,*

*wherein the second region has a threshold voltage range between the first region and the third region;*

*the verify voltage and the pre-charging voltage is maintained constantly during the verify operation regardless of the result of the first verify operation, and*

*the bit-line bias applied to the first bitline is higher than a ground voltage and lower than a program-inhibit voltage.*

*18. The method of claim 17, wherein the first memory cell is sensed as an off cell at the first verify operation and as an on cell at the second verify operation.*

*19. The method of claim 18, wherein the at least two different times include a first time for a first sense node develop operation of the first verify operation and a second time for a second sense node develop operation of the second verify operation, the first time being shorter than the second time.*

*20. The method of claim 17, wherein the program-inhibit voltage is a power supply voltage.*

*21. The method of claim 20, wherein the ground voltage is applied to a second bitline among the selected bitlines during the applying the second program voltage to the selected wordline, the second bitline being connected to a second memory cell included in the first region having a lower threshold voltage range than the second region, and the second memory cell being sensed as an on-cell at the first verify operation.*

*22. The method of claim 21, wherein the program-inhibit voltage is applied to a third bitline among the selected bitlines during the applying the second program voltage to the selected wordline, the third bitline being connected to a third memory cell included in the third region having a higher threshold voltage range than the second region, and the third memory cell being sensed as an off-cell at the first verify operation and the second verify operation.*

*23. The method of claim 18, wherein the nonvolatile memory device includes a memory cell array,*

*the memory cell array includes a first plurality of non-volatile memory cells storing one bit of data and a second plurality of nonvolatile memory cells storing more than one bit of data, and*

*the selected memory cells are included in the second plurality of nonvolatile memory cells.*

*24. A method of programming a nonvolatile memory device, comprising:*

*applying a first program voltage to a selected wordline to program selected memory cells included in the non-volatile memory device;*

*performing a verify operation by applying a verify voltage to the selected wordline and by applying a pre-charging voltage to at least one of selected bitlines connected to the selected memory cells to determine a programming status of the selected memory cells, the verify operation including a first verify operation and a second verify operation following the first verify operation, wherein the verify operation applies the verify voltage to the selected wordline at least two different times to divide the selected memory cells into at least three regions corresponding to different threshold voltage ranges, the at least three regions including a first region, a second region and a third region, and the verify operation including a first verify operation and a second verify operation following the first verify operation;*

*applying a second program voltage higher than the first program voltage to the selected wordline after the performing the verify operation; and*

*applying a bit-line bias to a first bitline among the selected bitlines during the applying the second program voltage to the selected wordline, the first bitline being connected to a first memory cell included in the second region, the bit-line bias applied to the first bitline is higher than a ground voltage and lower than a power supply voltage, and the first memory cell being sensed as off-cell at the first verify operation and sensed as on-cell at the second verify operation;*

*wherein the at least two different times include a first time for a first sense node develop operation of the first verify operation and a second time for a second sense node develop operation of the second verify operation, the first time being shorter than the second time,*

*the second region has a threshold voltage range between the first region and the third region;*

*the verify voltage and the pre-charging voltage is maintained constantly during the verify operation regardless of a result of the first verify operation.*

*25. The method of claim 24, wherein the nonvolatile memory device includes a memory cell array,*

*the memory cell array includes a first plurality of nonvolatile memory cells storing one bit of data and a second plurality of nonvolatile memory cells storing more than one bit of data, and*

*the selected memory cells are included in the second plurality of nonvolatile memory cells.*

*26. A method of programming a nonvolatile memory device, comprising:*

*performing a first program loop including:*

*applying a first program voltage to a selected wordline to program selected memory cells included in the nonvolatile memory device; and*

*performing a verify operation by applying a verify voltage to the selected wordline to determine a programming status of the selected memory cells, the verify operation including a first verify operation and a second verify operation following the first verify operation, and*

*performing a second program loop after the first program loop, the second program loop including:*

*applying a second program voltage higher than the first program voltage to the selected wordline; and*

*based on a result of the verify operation, applying a bit-line voltage to a first bitline connected to a first memory cell during the applying the second program voltage to the selected wordline, the bit-line voltage being higher than a ground voltage and lower than a program-inhibit voltage,*

*wherein the verify operation applies the verify voltage to the selected wordline at least two different times to divide the selected memory cells into at least three regions corresponding to different threshold voltage ranges,*

*the at least two different times include a first time for the first verify operation and a second time for the second verify operation, the first time being different from the second time,*

*the at least three regions include a first region, a second region and a third region, the second region having a higher threshold voltage range than the first region, the second region having a lower threshold voltage range than the third region, and*

*the verify voltage is maintained at a constant level during the verify operation, the verify operation including:*

*applying a pre-charging voltage to a first bitline among selected bitlines connected to the selected memory cells;*

*performing a first develop operation of a sense node while the sense node and the first bitline are coupled together during the first time; and*

*performing a first sensing operation to a first memory cell connected to the first bitline by sensing a first developed voltage of the sense node after the performing the first develop operation;*

*after the performing the first sensing operation, performing a second develop operation of the sense node while the sense node and the first bitline are coupled together during the second time; and*

*performing a second sensing operation to the first memory cell connected to the first bitline by sensing a second developed voltage of the sense node after the performing the second develop operation,*

*wherein the pre-charging voltage is maintained at a constant level during the verify operation regardless of a result of the first sensing operation,*

*the first memory cell is included in the second region, and*

*the first memory cell is sensed as off-cell at the first sensing operation and sensed as on-cell at the second sensing operation.*

*27. The method of claim 26, wherein the program-inhibit voltage is applied to a second bitline connected to a second memory cell among the selected memory cells during the applying the second program voltage to the selected wordline,*

*the second memory cell is included in the third region, and*

*the second memory cell is sensed as an off-cell at the first sensing operation and the second sensing operation.*

*28. The method of claim 27, wherein the ground voltage is applied a third bitline connected to a third memory cell among the selected memory cells during the applying the second program voltage to the selected wordline,*

*the third memory cell is included in the first region, and*

*the third memory cell is sensed as on-cell at the first sensing operation.*

*29. The method of claim 28, wherein the program-inhibit voltage is a power supply voltage.*

*30. The method of claim 26, wherein the nonvolatile memory device includes a memory cell array,*

*the memory cell array includes a first plurality of nonvolatile memory cells storing one bit of data and a second plurality of nonvolatile memory cells storing more than one bit of data, and*

*the selected memory cells are included in the second plurality of nonvolatile memory cells.*

*31. A method of programming a nonvolatile memory device, comprising:*

*applying a first program voltage to a selected wordline to program selected memory cells included in the nonvolatile memory device;*

*performing a verify operation by applying a verify voltage to the selected wordline and by applying a pre-charging voltage to at least one of selected bitlines connected to the selected memory cells to determine a programming status of the selected memory cells, the verify operation including a first verify operation and a second verify operation following the first verify operation, wherein the verify operation applies the verify voltage to the selected wordline at least two different times to divide the selected memory cells into at least three regions corresponding to different threshold voltage ranges, the at least three regions including a first region, a second region and a third region;*

*applying a second program voltage higher than the first program voltage to the selected wordline after the performing the verify operation; and*

*based on a result of the first verify operation and a result of the second verify operation, applying a bit-line bias to a first bitline among the selected bitlines during the applying the second program voltage to the selected wordline, the first bitline being connected to a first memory cell included in the second region,*

*wherein the second region has a threshold voltage range between the first region and the third region;*

*the pre-charging voltage is maintained constantly during the verify operation regardless of the result of the first verify operation, and*

*the bit-line bias applied to the first bitline is higher than a ground voltage and lower than a program-inhibit voltage.*

*32. The method of claim 31, wherein the first memory cell is sensed as off cell at the first verify operation and as an on cell at the second verify operation.*

*33. The method of claim 32, wherein the at least two different times include a first time for a first sense node develop operation of the first verify operation and a second time for a second sense node develop operation of the second verify operation, the first time being shorter than the second time.*

*34. The method of claim 31, wherein the program-inhibit voltage is a power supply voltage.*

*35. The method of claim 34, wherein the ground voltage is applied to a second bitline among the selected bitlines during the applying the second program voltage to the selected wordline, the second bitline being connected to a second memory cell included in the first region having a lower threshold voltage range than the second region, and the second memory cell being sensed as on-cell at the first verify operation.*

*36. The method of claim 35, wherein the program-inhibit voltage is applied to a third bitline among the selected bitlines during the applying the second program voltage to the selected wordline, the third bitline being connected to a third memory cell included in the third region having a higher threshold voltage range than the second region, and the third memory cell being sensed as off-cell at the first verify operation and the second verify operation.*

*37. The method of claim 31, wherein the verify voltage is maintained constantly during the verify operation regardless of the result of the first verify operation.*

*38. A method of programming a nonvolatile memory device, comprising:*

*applying a first program voltage to a selected wordline to program selected memory cells included in the nonvolatile memory device;*

*performing a verify operation by applying a verify voltage to the selected wordline and by applying a pre-charging voltage to at least one of selected bitlines connected to the selected memory cells to determine a programming status of the selected memory cells, the verify operation including a first verify operation and a second verify operation following the first verify operation, wherein the verify operation applies the verify voltage to the selected wordline at least two different times to divide the selected memory cells into at least three regions corresponding to different threshold voltage ranges, the at least three regions including a first region, a second region and a third region;*

*applying a second program voltage higher than the first program voltage to the selected wordline after the performing the verify operation; and*

*based on a result of the first verify operation and a result of the second verify operation, applying a bit-line bias to a first bitline among the selected bitlines during the applying the second program voltage to the selected wordline, the first bitline being connected to a first memory cell included in the second region,*

*wherein the second region has a threshold voltage range between the first region and the third region;*

*the pre-charging voltage is not discharged during the verify operation regardless of the result of the first verify operation, and*

*the bit-line bias applied to the first bitline is higher than a ground voltage and lower than a program-inhibit voltage.*

*39. The method of claim 38, wherein the pre-charging voltage is not discharged to the ground voltage during the verify operation regardless of the result of the first verify operation.*

*40. The method of claim 39, wherein the pre-charging voltage is maintained constantly during the verify operation regardless of the result of the first verify operation.*

*41. The method of claim 40, wherein the verify voltage is maintained constantly during the verify operation regardless of the result of the first verify operation.*

*42. The method of claim 38, wherein the first memory cell is sensed as off cell at the first verify operation and as an on cell at the second verify operation.*

*43. The method of claim 39, wherein the at least two different times include a first time for a first sense node develop operation of the first verify operation and a second time for a second sense node develop operation of the second verify operation, the first time being shorter than the second time.*

*44. The method of claim 38, wherein the program-inhibit voltage is a power supply voltage.*

*45. The method of claim 41, wherein the ground voltage is applied to a second bitline among the selected bitlines during the applying the second program voltage to the selected wordline, the second bitline being connected to a second memory cell included in the first region having a lower threshold voltage range than the second region, and the second memory cell being sensed as on-cell at the first verify operation.*

*46. The method of claim 42, wherein the program-inhibit voltage is applied to a third bitline among the selected bitlines during the applying the second program voltage to the selected wordline, the third bitline being connected to a third memory cell included in the third region having a higher threshold voltage range than the second region, and the third memory cell being sensed as off-cell at the first verify operation and the second verify operation.*

* * * * *